United States Patent [19]

Kehl et al.

[11] Patent Number: 5,033,866
[45] Date of Patent: Jul. 23, 1991

[54] MULTIPLE THERMOCOUPLE SENSOR

[75] Inventors: Thomas Kehl, Uster, Switzerland; Gosse van der Plaats, Susteren, Netherlands

[73] Assignee: Mettler Toledo AG, Greifensee, Switzerland

[21] Appl. No.: 458,994

[22] Filed: Dec. 29, 1989

[30] Foreign Application Priority Data

Apr. 24, 1989 [CH] Switzerland ............... 1548/89

[51] Int. Cl.$^5$ .................. G01K 7/02; H01L 35/20
[52] U.S. Cl. ..................... 374/179; 136/225; 136/236.1
[58] Field of Search ............ 374/179, 13, 10; 136/211, 225

[56] References Cited

U.S. PATENT DOCUMENTS

| | | | |
|---|---|---|---|
| 3,298,220 | 1/1967 | Stone et al. | 374/13 |
| 4,095,453 | 6/1978 | Woo | 374/13 |
| 4,111,717 | 9/1978 | Baxter | 136/225 |
| 4,363,927 | 12/1982 | Wilson | 136/212 X |
| 4,451,690 | 5/1984 | Ishida | 136/225 X |
| 4,456,919 | 6/1984 | Tomita et al. | 136/225 X |

FOREIGN PATENT DOCUMENTS 0034538 2/1981 European Pat. Off.
1205598 11/1965 Fed. Rep. of Germany.
2233515 1/1973 Fed. Rep. of Germany.

OTHER PUBLICATIONS

Arbeitsmethoden der Thermodynamik Band II, pp. 240-241 Franz E. Eder Springer Verlag Berlin Heidelberg New York (1983).
Thin Film Micro-Differential Analysis, Journal of Physics E., vol. 7, No. 5, pp. 355-357, May 1974.
Modulares Thermoanalysen-System TA 2000, Mettler 1.7102.71.A (1973).
Mettler Thermoanalysen-System TA 3000, 1986, ME-724073.
Mettler DDK Messzellen, 1988, ME-724135.
Know-How Live Mettler, Thermoanalyse, 1988, ME-724127.

Primary Examiner—Daniel M. Yasich
Attorney, Agent, or Firm—Toren, McGeady & Associates

[57] ABSTRACT

A multiple thermocouple sensor for thermal analysis includes a plurality of thermocouples with elements and element junctions mounted on a carrier plate in the form of a thick film. The elements extend in semicircles and the element junctions are arranged in a circle to form a measuring point. Each measuring point has an electric connection. Since the thermocouples are in the form of thick film, they can be arranged closely together. Twenty element junctions may be provided at each measuring point. A sample dish and a reference dish used at the measuring points have multiple contact with the element junctions. This increases not only the measuring accuracy but also the sensitivity of the multiple thermocouple sensor.

17 Claims, 4 Drawing Sheets

MULTIPLE THERMOCOUPLE SENSOR

BACKGROUND OF THE INVENTION

1. Field of the Invention

The present invention relates to a multiple thermocouple sensor for use in thermal analysis. The sensor has individual thermocouples which are connected in series and are mounted on an electrically non-conductive material. The thermocouples have elements which extend at least essentially parallel to each other and are arranged in a semicircle between element junctions. The element junctions are arranged around a center to form a measuring point. Each measuring point has an electric connection. The present invention further relates to a thermal analysis oven. The oven includes an oven body which can be closed by means of a cover and can be heated by means of an electric heating device. A measuring cell including the above-described multiple thermocouple sensor is arranged in the oven.

2. Description of the Related Art

In known multiple thermocouple sensors and thermal analysis ovens of the above-described type, the individual thermocouples are mounted on a carrier material with the elements and junctions thereof by means of thin film technology, for example, by vapor depositing or sputtering in a vacuum. The thermocouples applied in this manner have a layer thickness of approximately 0.5 $\mu$ ($1\mu$ or $\mu$m equalling 1/1000 mm) and 5 element junctions are provided for each measuring point (see, for example, brochures of Mettler Instrumente AG, CH-8606 Greifensee: "Modulares Thermoanalysen-System TA 2000" [Modular Thermal Analysis System], Mettler 1.7102.71.A (1973); "Mettler Thermoanalysen-System TA 3000" [Mettler Thermal Analysis System], 1986, ME-724073; "Mettler DDK Messzellen" [Mettler DSC Measuring Cells], 1988, ME-724135; "Know-How Live Mettler, Thermoanalyse" [Know-How Live Mettler, Thermal Analysis], 1988, ME-724127.

In certain cases, the thermocouple sensors composed of a thin film have low mechanical and chemical resistance which cannot be eliminated even when the thermocouples are composed of alternating element layers and insulating layers of thin film arranged between the element layers. This is because each insulating layer has the same thickness as the thermocouple element layer. The thermocouple element layer may be subject to chemical attack because of, for example, porosity of the thin films, particularly of the insulating films. Therefore, when using the known thermocouple sensor, for example, in a chemically aggressive environment, for example, in an environment containing cyanogen gas, the durability of the sensor is not ensured even if noble metals are used as element pairs. In these known multiple thermocouple sensors, the measured signal is small, for example, when the temperature difference $\Delta T$ is small, so that the measurement accuracy is low. Accordingly, the sensitivity of these known sensors is in some cases not always sufficient. Moreover, as is well known, the manufacturing of thin films is expensive.

In addition, in other known multiple thermocouple sensors, the thermocouples are arranged in a star-shaped manner. However, in this arrangement, only a limited number of thermocouples can be arranged for a desired size of the measuring point (see, for example, German Auslegeschrift 1,205,598; German Offenlegungsschrift 2,233,515).

It is, therefore, the primary object of the present invention to provide a multiple thermocouple sensor of the above-described type with high sensitivity and good chemical and mechanical resistance. Also, the sensor is to be inexpensive to manufacture. Finally, the sensor is to be capable of being used in a thermal analysis oven of the above-described type.

SUMMARY OF THE INVENTION

In accordance with the present invention, the above object is met in a multiple thermocouple sensor in which the elements and element junctions of the individual thermocouples are present as a thick film.

Thus, thick film technology can be used for manufacturing the multiple thermocouple sensor according to the present invention.

As is known in the art, thick film technology refers to a method in the field of electronics for manufacturing conductors by applying conductive materials in the form of pastes on an non-conductive substrate by means of a screen printing process. The conductors are premanently fixed by a subsequent heat treatment, i.e., firing.

In contrast, as indicated above, thin film technology refers to a process carried out in a vacuum, for example, vapor depositing or sputtering. This process is predominantly used in the manufacture of structural semiconductor elements.

While the thickness of the film depends on the technology of manufacturing the film (thin film typically thinner than 1 micron; thick film typically thicker than several microns), the possible width of the conductors is also very different for both technologies. Thick film technology is suitable for large dimensions, i.e., 0.05 mm to 2 mm, while it is possible to produce conductors with a width down to 0.001 mm by thin film technology.

Compared to thin film technology, thick film technology is less expensive and simpler to carry out.

Compared to previously known thermocouple sensors manufactured by means of the thin film technology, the thick film reduces the porosity and increases the mechanical strength, so that a resistance is obtained which makes it possible to expand the practical use of the multiple thermocouple sensor according to the invention, including in the field of thermal analysis. Because the individual thermocouple elements are provided as a thick film, the measuring signal is great even if the temperature difference $\Delta T$ is small. This is because a plurality of thermocouples and, thus, element junctions can be provided. However, not only the measuring accuracy is increased, but the sensitivity of the thermocouple sensor is substantially improved. The sensitivity of the sensor according to the present invention is at least twice that of the previously known multiple thermocouple sensors.

Another object of the present invention is met by a thermal analysis oven of the above-described type which includes in its measuring cell the multiple thermocouple sensor according to the present invention in which the individual thermocouples with the elements and element junctions thereof are present as a thick film. Thus, the above-described advantages of the multiple thermocouple sensor according to the present invention are also obtained in the thermal analysis oven.

In accordance with an advantageous feature of the present invention, the thermocouples have a thickness of 5 to 15$\mu$, preferably 10$\mu$. At least 10, preferably 10 to 60 thermocouples may be provided for each measuring point, i.e., preferably at least twice the number of thermocouples compared to the previously known thermocouple sensors. The element junctions are preferably arranged in a circle around the center; however, they may also be arranged around the center in a different geometric arrangement. When the element junctions are arranged on a circle having a diameter of 5 mm, 20 element junctions can be provided at each measuring point, i.e., one element junction per mm$^2$. The thermocouple elements are arranged in semicircles, for example, polygonal or circular semicircles which are placed against each other at the bases thereof.

The individual thermocouples may be arranged electrically insulated from each other either parallel next to each other or one above the other and are covered to the outside preferably with an electrically insulating layer. In accordance with another feature, thermocouple elements and electrically insulating layers may be arranged alternatingly above each other. The electrically insulating layers preferably have the same thickness as the thermocouple layers. Because of the preferably equal thickness of thermocouple layers and insulating layers, the porosity of the insulating layer is also reduced and, thus, the mechanical and chemical resistance of the multiple thermocouple sensor according to the invention is increased.

The electrically insulating layers which are preferably also present in the form of a thick film may contain a ceramic material. Such a material is available, for example, from W.C. Heraeus GmbH, D-6450 Hanau, Federal Republic of Germany.

The thermocouples preferably contain a noble metal, especially gold-gold/platinum, gold-gold/palladium, gold/palladium-platinum/palladium, silver-silver/palladium or silver-platinum. However, other element compositions which include at least one noble metal may be used.

The metals or metal pairs of the thermocouples may be applied, for example, as thick film pastes. Thick film pastes, for example, for gold-gold/platinum (Au-Au/Pt) are available from W.C. Heraeus GmbH, D-6450 Hanau, Federal Republic of Germany.

The electrically non-conductive material can be mounted on a carrier, for example, a carrier plate for the thermocouples, or on a carrier which is made of a metal, for example, steel or of a non-metal. A carrier material on the basis of metal with an insulating layer is available from the above-mentioned manufacturer. The electrically non-conductive metal or non-metal may be ceramic material, aluminum oxide, glass ceramic material, barium aluminum borsilicate composition sold under the name Pyrex or the like.

In accordance with further features of the present invention, the carrier plate for the multiple thermocouple sensor may be round, for example, circular or oval or polygonal, for example, rectangular. The manufacture of the thermocouples can be carried out in accordance with known methods for preparing thick films, i.e., they may be applied, for example, in the form of pastes, by the screen printing method or the like. These types of methods are less expensive than the manufacturing methods for a thin film. In fact, the manufacture of a thin film may be ten times as expensive as the manufacture of a thick film. The multiple thermocouple sensor according to the invention may be used for the differential scanning calorimetry (DSC) or also for differential thermal analysis (DTA).

The various features of novelty which characterize the invention are pointed out with particularity in the claims annexed to and forming a part of this disclosure. For a better understanding of the invention, its operating advantages attained by its use, reference should be had to the drawing and descriptive matter in which there are illustrated and described preferred embodiments of the invention.

DESCRIPTION OF THE PREFERRED EMBODIMENTS

Figure 1:
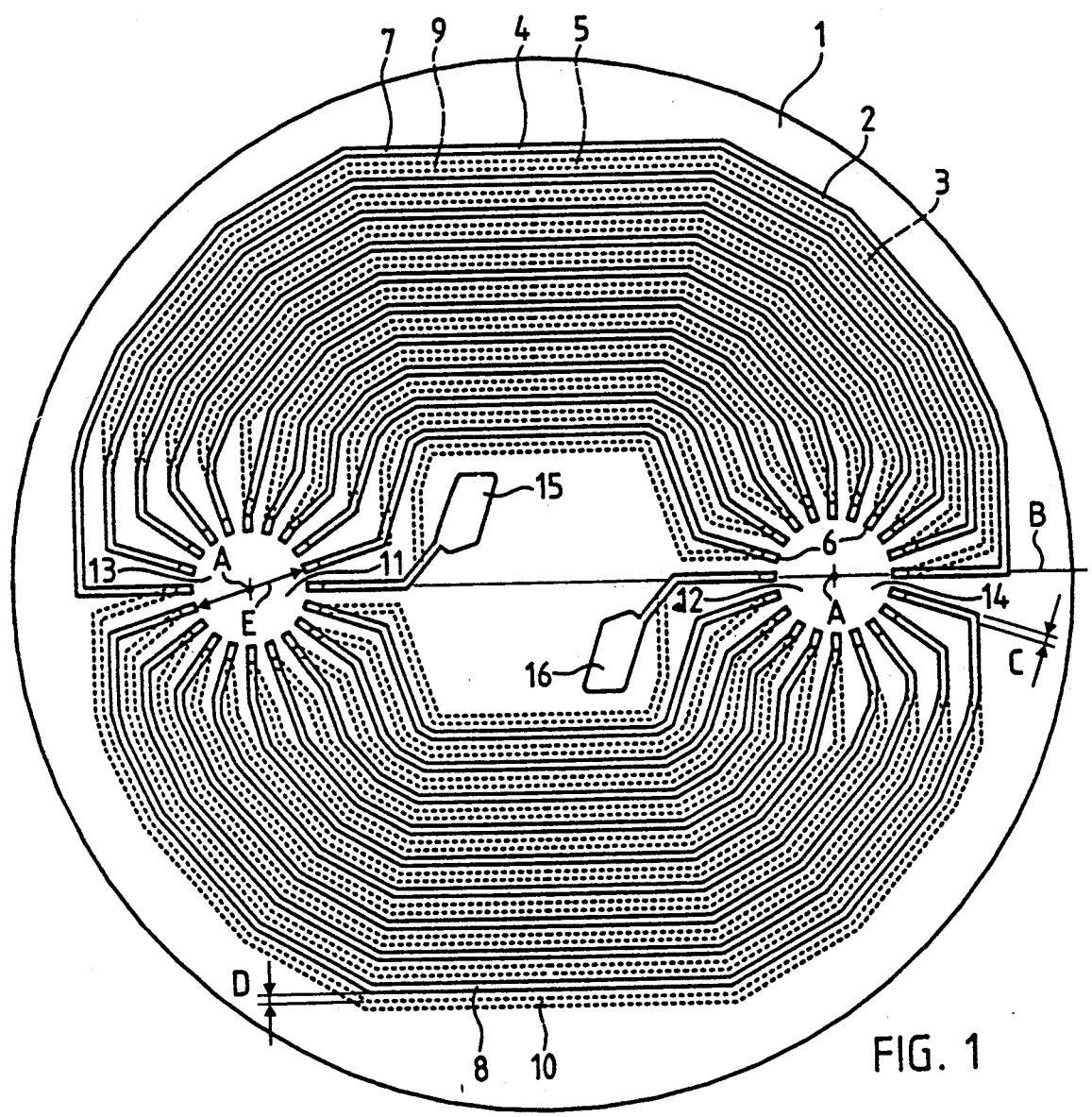
FIG. 1 is a schematic top view of a multiple thermocouple sensor according to the present invention.

In the multiple thermocouple sensor according to FIG. 1, a plurality of individual thermocouples 2 and 3 with thermocouple elements 4 and 5 are mounted on a circular carrier plate 1. Specifically, 40 individual thermocouples 2 and 3 are provided. The elements 4 and 5 are connected to each other at element junctions 6. The thermocouples are connected in series, so that a thermopile composed of a plurality of successively connected thermocouples 2 and 3 is present.

The carrier plate 1 is of an electrically non-conductive material. The thermocouples 2 and 3 each contain at least one noble metal, wherein the thermocouples 2, 3 may consist, for example, of noble metal pairs as they have been described above. The elements 4 and 5 of the thermocouples 2 and 3 are arranged in a plane essentially parallel between the element junctions 6 and extend in a semicircle 7 and 8, or 9 and 10, which border at each other at the base B. For clarity's sake, the thermocouples 2 are shown in FIG. 1 in solid lines and the thermocouples 3 are shown in broken lines. The thermocouples 2 and 3 with the elements 4 and 5 and the element junctions 6 are mounted in the form of a thick film. In this manner, a plurality of 40 individual thermocouples can be arranged.

The element junctions 6 are arranged in a circle around a center A and the resulting openings 11 and 12 form a measuring point 13 and 14, respectively. Each measuring point 13, 14 has at one end of the thermopile an electric connection 15 and 16, respectively, which can be connected to the input of a measuring device. Small dishes can be placed in the measuring points 13 and 14. Thus, a plurality of individual element junctions 6 is provided for each dish. A substance can be placed in each dish, and a thermal analysis can then be carried out. For example, measuring point 13 may be the reference point and the measuring point 14 may be the sample measuring point.

As FIG. 1 further shows, the elements 4 and 5 are arranged in the form of polygonal semicircles. However, the elements may also be arranged as circular semicircles between the element junctions, not illustrated. The thermocouples 2 and 3 are arranged with their elements 4 and 5 at a sufficient distance from each other, so that they are mounted insulated from each other and parallel to each other. The individual thermocouples 2 and 3 may have a width C of $50\mu$ to $250\mu$, preferably $150\mu$ and may be spaced from each other at a distance D. Distance D may correspond to width C, for example, the distance D may be $50\mu$ to $250\mu$. On the outer or upper side visible in FIG. 1, the thermocouples are preferably covered, for example, by a transparent electrically insulating layer, not shown, which may extend over the entire upper surface of the thermocouple sensor.

The arrangement of a plurality of thermocouples mounted as a thick film and closely together makes it possible to provide at each measuring point 13 and 14 twenty element junctions 6 in a circle having a diameter E of 5 mm. Thus, twenty element junctions 6 are available for each dish used at one of the measuring points 13 and 14. This was not possible in the past when using the known multiple thermocouple sensors for thermal analysis. The sensor according to the present invention makes possible a better utilization of the measuring points and, as already described above, the measuring accuracy and the sensitivity are substantially improved.

Figure 2:
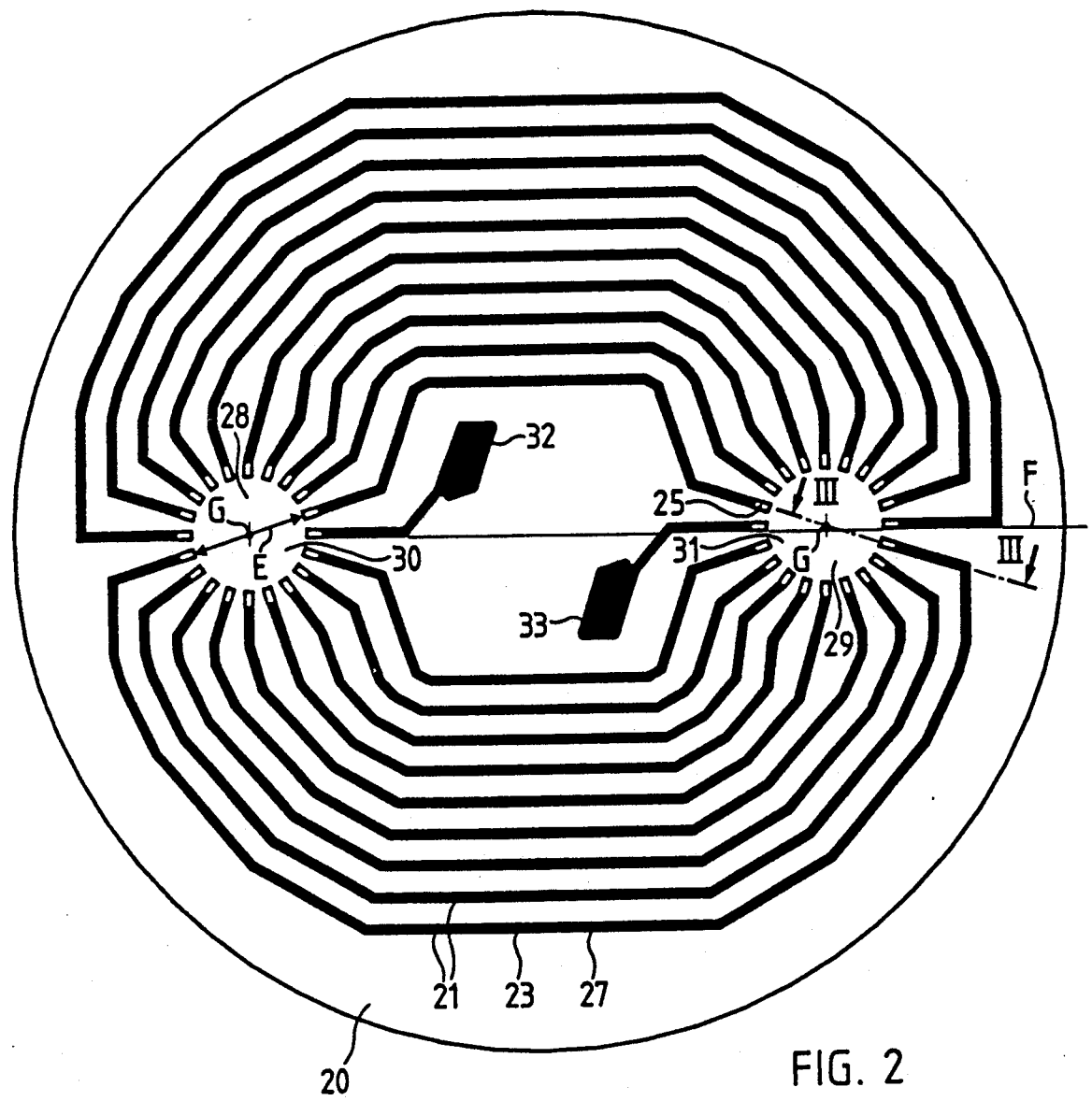
FIG. 2 is a schematic top view of another multiple thermal sensor according to the present invention.
Figure 3:
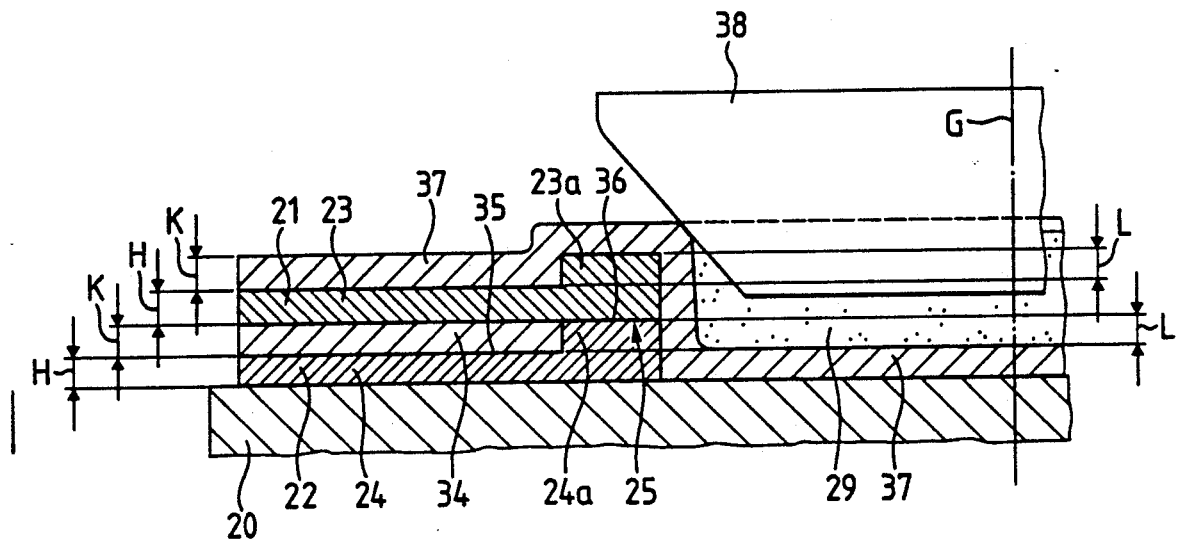
FIG. 3 is a schematic sectional view of the multiple thermocouple sensor of FIG. 2 taken along sectional line III—III.

In the embodiment of the multiple thermocouple sensor illustrated in FIGS. 2 and 3, twenty individual thermocouples 21 and 22 are mounted on a circular carrier plate 20. The thermocouples 21 and 22 again have elements 23 and 24, respectively, which are connected to each other and in series at the element junctions 25, so that again a thermopile composed of a plurality of individual theremocouples is formed. As FIG. 3 further shows, the thermocouples 21 and 22 are arranged above each other, so that only the upper thermocouples 21 are visible in FIG. 2. The elements 23 of the thermocouples 21 and the elements 24 of the thermocouples 22 are arranged between the element junctions 25 in the form of semicircles 26 and 27 which are located next to each other at their bases F and have the shape of a partial polygon.

The element junctions 25 are again arranged in the form of a circle around a center G, so that a measuring point 30 and 31 each is formed at the openings 28 and 29, respectively. The measuring points 30 and 31 each have an electric connection 32 and 33, respectively. Concerning the details of the individual thermocouples and the advantages obtained by the thermocouples, reference is made to the above description, particularly with respect to the embodiment shown in FIG. 1.

As FIG. 3 further shows, the thermocouples 22 are mounted directly on the carrier plate 20 as thick film, preferably having a thickness H of $10\mu$. An electrically insulating layer 34 is placed on each element 24 of the thermocouple 22. The electrically insulating layer 34 extends over most of the upper surface 35 of the thick film layer of the element 24. The free end of the element 24 facing the center G has an upwardly directed increased thickness portion 24a, the upper surface 36 of which is not covered by the insulating layer 34. A thick film layer of element 23 of the thermocouple 21 which again has a thickness H of $10\mu$ is placed on the insulating layer 34 and the upper surface 36 of the increased thickness portion 24a of element 24. The element junction 25 is formed because the free metal upper surface 36 of the increased thickness portion 24a of the thermocouple 22 is in immediate electric contact with the thermocouple 21. Another insulating layer 37 is placed over the thermocouple 21 and the remaining parts of the multiple thermocouple sensor, so that the thermocouples are protected and a short-circuit due to direct contact of a dish with the element junctions 25 is avoided. The thick film layer of the thermocouple 21 has at its free end facing the center G again an upwardly directed increased thickness portion 23a, so that a support is provided for a dish 38, only partially shown, to be placed in the opening 28 at the junction 25. The insulating layers 34 and 37 have a thickness K which is equal to or essentially equal to the thickness H of the thermocouples 21 and 22. The increased thickness portions 23a and 24a have a thickness L beginning at the upper surface of the elements. The thickness L corresponds to the thickness H of the elements of the thermocouples 21 and 22.

Figure 4:
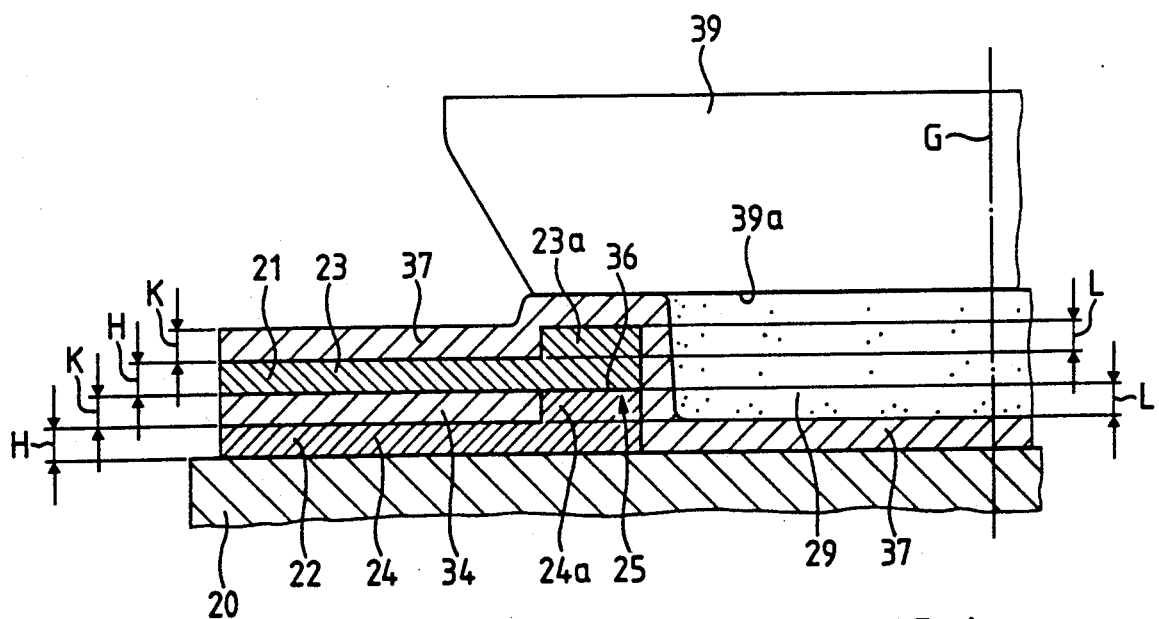
FIG. 4 is a schematic sectional view of another embodiment of the thermocouple sensor of FIG. 3.

In the embodiment of the multiple thermocouple sensor shown in FIG. 4, in which equivalent components have the same reference numerals as in FIG. 3, a dish 39 extends with its bottom 39a over the opening 29 of the measuring point 31 and, thus, is placed over the increased thickness portion 23a. This provides a support surface for the dish 39 relative to the element junctions 25.

Figure 5:
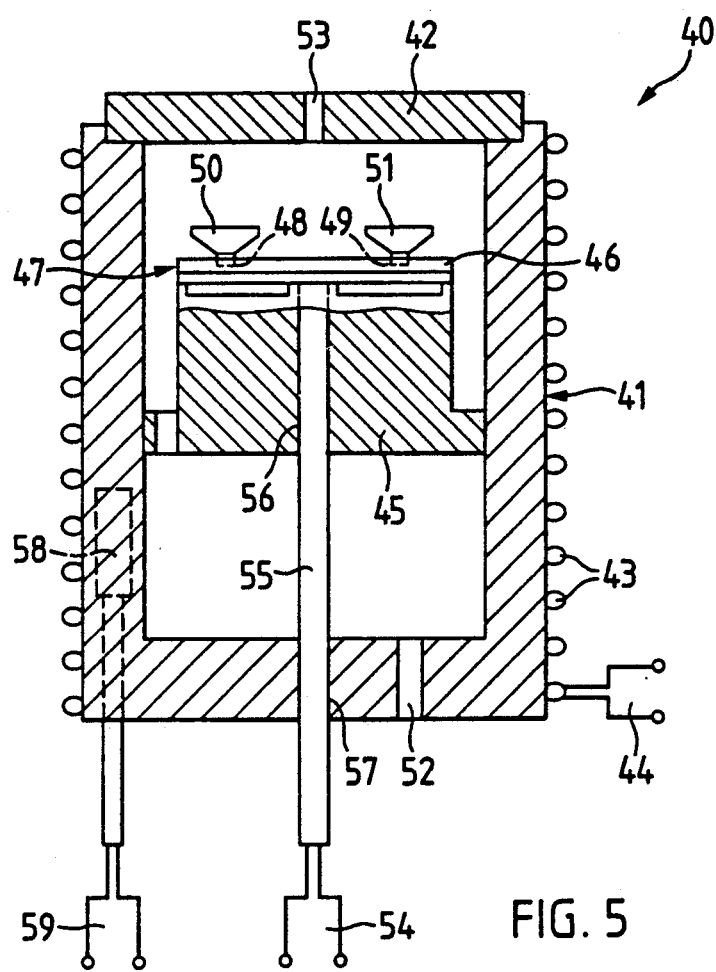
FIG. 5 is a schematic side view, partly in section, of a thermal analysis oven according to the present invention.

FIG. 5 of the drawing shows a thermal analysis oven 40 with an oven body 41 which can be closed by means of a cover 42. The oven body 41 has an electric heating device 43 with electric connections 44 for heating the thermal analysis oven 40. A measuring cell 46 which includes one of the embodiments of the multiple thermocouple sensors 47 according to the present invention described above is placed on a stand 45 in the oven body 41. Accordingly, the thermal analysis oven 40 contains a measuring cell with a multiple thermocouple sensor in which the individual thermocouples with the elements and element junctions thereof are present in the form of a thick film. The multiple thermocouple sensor 47 includes measuring points 48 and 49 wherein, for example, a sample dish 50 is measuring point 48 and a reference dish 51 is placed in the measuring point 49. The multiple thermocouple sensor is constructed as described above.

A material placed in the sample dish 50 can be subjected to a thermal analysis relative to the material in the reference dish 51.

The thermal analysis oven has an opening 52 through which, for example, a purge gas can be conducted. The purge gas is discharged through an opening 53 in cover 42. Opening 53 has a diameter of approximately 1 mm. The multiple thermocouple sensor 47 can be connected with its electrical connections, not shown, through electric lines 54, for example, to a measuring device, also not shown. The electric lines 54 extend from the multiple thermocouple sensor 47 through a tube 55 which, in turn, extends through a duct 56 in the stand 45 and an opening 57 in the oven body 41. The oven body 41 is additionally equipped with a temperature measuring sensor 58 with electric connections 59 for measuring and controlling the heating temperature in the oven 40.

While specific embodiments of the invention have been shown and described in detail to illustrate the application of the inventive principles, it will be understood that the invention may be embodied otherwise without departing from such principles.

We claim:

1. In a multiple thermocouple sensor mounted in a thermal analysis oven, the thermal analysis oven including an oven body, a cover for closing the oven body and electric heating device for heating the oven, and a measuring cell, the measuring cell including a multiple thermal analysis sensor for a thermal analysis, the sensor including a plurality of individual thermocouples which are connected in series, the thermocouples being mounted on an electrically non-conductive material, the thermocouples including elements arranged at least essentially parallel to each other and semicircularly between element junctions, the element junctions being arranged around a center to form a measuring point, each measuring point having an electric connection, the improvement comprising the individual thermocouples with the elements and element junctions thereof being in the form of a thick film wherein said thermocouples have a thickness of 5 to 15 $\mu$.

2. The sensor according to claim 1 wherein the thermocouples are mounted on a carrier plate.

3. The sensor according to claim 1, the thermocouples each having a free upper surface, the upper surfaces being covered by an electrically non-conductive layer.

4. The sensor according to claim 1, wherein the thermocouples have a thickness of 10$\mu$.

5. The sensor according to claim 1 wherein the element junctions are arranged around the center in a circle.

6. The sensor according to claim 5, wherein each measuring point has 20 element junctions arranged on a circle having a diameter of 5 mm.

7. The sensor according to claims 5, wherein each measuring point has 10 to 60 element junctions.

8. The sensor according to claim 1, wherein the elements extend in the form of semicircles having bases, the bases being located adjacent each other.

9. The sensor according to claim 1, wherein the elements extend in the form of polygonal semicircles having bases, the bases being arranged adjacent each other.

10. The sensor according to claim 1, wherein the individual thermocouples are mounted parallel next to each other and electrically insulated from each other.

11. The sensor according to claim 1 wherein the individual thermocouples are mounted parallel above each other and electrically insulated from each other.

12. The sensor according to claim 1, wherein the thermocouples include at least one noble metal.

13. The sensor according to claim 12, wherein the noble metal is gold-gold/platinum, gold-gold/palladium, gold/palladium-platinum/palladium, silver-silver/palladium or silver-platinum.

14. The sensor according to claim 1, wherein the electrically non-conductive material is the carrier of the sensor.

15. The sensor according to claim 1, wherein the electrically non-conductive material is a non-metal selected from the group consisting of ceramic material, aluminum oxide, glass ceramic material, and barium aluminum forsilicate compositions.

16. The sensor according to claim 1, wherein the electrically non-conductive material is mounted on a carrier made of an electrically non-conductive material.

17. The sensor according to claim 1, wherein the electrically non-conductive material is mounted on a carrier made of an electrically conductive material.

* * * * *